United States Patent [19]

Chang et al.

[11] Patent Number: 5,258,949
[45] Date of Patent: Nov. 2, 1993

[54] NONVOLATILE MEMORY WITH ENHANCED CARRIER GENERATION AND METHOD FOR PROGRAMMING THE SAME

[75] Inventors: Ko-Min Chang; Ming-Bing Chang, both of Austin, Tex.

[73] Assignee: Motorola, Inc., Schaumburg, Ill.

[21] Appl. No.: 620,813

[22] Filed: Dec. 3, 1990

[51] Int. Cl.⁵ .............................................. G11C 13/00
[52] U.S. Cl. .................... 365/185; 365/189.01
[58] Field of Search ............ 365/185, 189.01, 230.01; 357/23.05

[56] References Cited

U.S. PATENT DOCUMENTS

| | | | |
|---|---|---|---|
| 4,434,478 | 2/1984 | Cook | 365/185 |
| 4,794,565 | 12/1988 | Wu et al. | 365/185 |
| 4,804,637 | 2/1989 | Smayling et al. | 437/52 |
| 4,813,018 | 3/1989 | Kobayashi et al. | 365/185 |
| 5,022,009 | 6/1991 | Terada | 365/185 |
| 5,042,009 | 8/1991 | Kazerounian | 365/189.01 |
| 5,047,981 | 9/1991 | Gill | 365/185 |
| 5,111,427 | 5/1992 | Kobayashi | 365/185 |

Primary Examiner—Eugene R. LaRoche
Assistant Examiner—A. Zarabian
Attorney, Agent, or Firm—Patricia S. Goddard

[57] ABSTRACT

Programming speed of a nonvolatile memory is improved by enhancing carrier generation. In one form, a nonvolatile memory has a control gate which overlies a channel region in a substrate. A floating gate overlies a portion of the channel region and is positioned between the substrate and the control gate. A source and a drain are formed in the substrate, being displaced by the channel region. A first programming voltage is applied to the drain to create an electric field at a junction between the drain and channel region. Current is forced into the source and through the substrate in order to enhance carrier generation at the junction between the drain and channel region, thereby increasing an electric field at the junction. A second programming voltage, having a ramp shaped leading edge, is applied to the control gate to increase the electrical field and to program the memory to a predetermined logic state.

14 Claims, 2 Drawing Sheets

NONVOLATILE MEMORY WITH ENHANCED CARRIER GENERATION AND METHOD FOR PROGRAMMING THE SAME

TECHNICAL FIELD OF THE INVENTION

This invention relates to nonvolatile memory devices in general, and more specifically to flash EEPROMs (electrically erasable programmable read-only memories).

BACKGROUND OF THE INVENTION

Performance of EEPROMs are considered by many to be a substantial improvement over EPROMs (erasable programmable read-only memories). While EPROMs require an ultraviolet light source to erase stored information, EEPROMs can be erased with electric signals. Not only is electrical erasure faster, but it allows a single byte of information to be erased whereas ultraviolet light will erase all information stored in an EPROM memory device. One drawback to using EEPROMs is that cell size of an EEPROM is considerably larger, due to the fact that an EEPROM cell has two transistors while an EPROM has only one. Thus in applications in which circuit density is extremely important, a EEPROM may not be as desirable as an EPROM.

A type of memory device, called a flash EEPROM, has been developed which provides electrical erasing capability and has a circuit density comparable to an EPROM. Structurally, a flash EEPROM is most often similar to an EPROM, although several different structures have been demonstrated. Functionally, a flash EEPROM can be programmed by hot electron injection, like an EPROM, and is erased via Fowler-Nordheim tunneling, as an EEPROM. However, a disadvantage which exists with a flash EEPROM that does not exist with either conventional EPROMs or EEPROMs is a programming time delay due to over-erasure. In a flash EEPROM, erasing is accomplished by applying a bias to a source so that electrons stored in a floating gate tunnel to the source region. However in doing so, the floating gate often becomes positively charged, thereby lowering the threshold voltage ($V_T$) of the channel region. Lower $V_T$ values correspond to weak hot electron generation, thus time involved in programming a memory cell is increased. Typically in programming a flash EEPROM cell, a control gate and a drain region are brought to a relatively high voltage, thereby creating an electric field at a junction of the channel region and drain and generating hot electrons at the junction. These electrons are then injected into the floating gate, thereby charging, or programming, the cell. If $V_T$ is low, the electric field which is created is weak, and electron generation at the junction is reduced. Thus, a lower $V_T$ implies a longer programming time.

A few solutions to programming delays are known; however, the solutions typically have other problems which make implementation undesirable. For example, one solution is to dope the channel region more heavily. While a higher doping concentration prevents $V_T$ from becoming too low during an erase operation, a highly doped channel region will have fewer mobile carriers, and thus will have a lower read current. Low read currents are undesirable because more time is required to sense whether or not the channel region is "ON" or "OFF", in other words to read the logic state of the memory cell. Another solution to programming delays is to avoid over-erasing the memory cell, or to avoid lowering the threshold voltage. This can be accomplished by a series of "partial erasures" and sensing after each erasure whether or not the cell has been erased. A problem with a series of erasures is that the time necessary to erase a cell is significantly increased, and is therefore unfavorable. Yet another solution to programming delays, which will be described in more detail at a later point, is to apply a series of pulse programming voltages to the control gate of the cell. While pulsing the programming voltage enhances electron injection into the floating gate of the cell, several pulses are required, thus programming time is increased.

Therefore, a need exists for an improved nonvolatile memory device, and more specifically for a nonvolatile memory device which is electrically erasable, which has dense circuitry, and which has improved programming speed over conventional, erasable nonvolatile memories.

BRIEF SUMMARY OF THE INVENTION

The previously mentioned needs are fulfilled with the present invention. In one form, a nonvolatile cell has a control gate overlying a channel region in a substrate. A floating gate overlies a portion of the channel region and is located between the substrate and the control gate. First and second diffused regions are formed in the substrate, and are displayed by the channel region. The cell is programmed by applying a first programming voltage to the first diffused region to create an electric field at a junction between the first diffused region and the portion of the channel region underlying the floating gate. Current is forced into the second diffused region and through the substrate in order to enhance carrier generation at the junction. A second programming voltage, having a ramp shaped leading edge, is applied to the control gate to increase the electrical field and to program the cell to a predetermined logic state.

DETAILED DESCRIPTION OF THE INVENTION

A majority of known flash EEPROM cells are programmed by hot electron injection. An electrical field is created under a floating gate at a drain junction. Electrons at this junction become "hot" and are injected into the overlying floating gate where the electron charge is trapped. Programming a flash EEPROM cell can thus be characterized into two processes: electron generation at a junction; and electron injection into the floating gate. Typically, the rate limiting step of programming a flash EEPROM is electron generation because electron injection can be achieved quite easily. By applying a large enough positive voltage to a control gate, a sufficient potential is created to inject electrons into the floating gate. A large percentage of programming time involves creating enough hot electrons at the drain junction to permit a reasonable rate of electron injection. The present invention improves the programming speed of a flash EEPROM cell by increasing the amount of electrons available at the drain junction to be injected, or in other words by improving electron generation.

Figure 1:
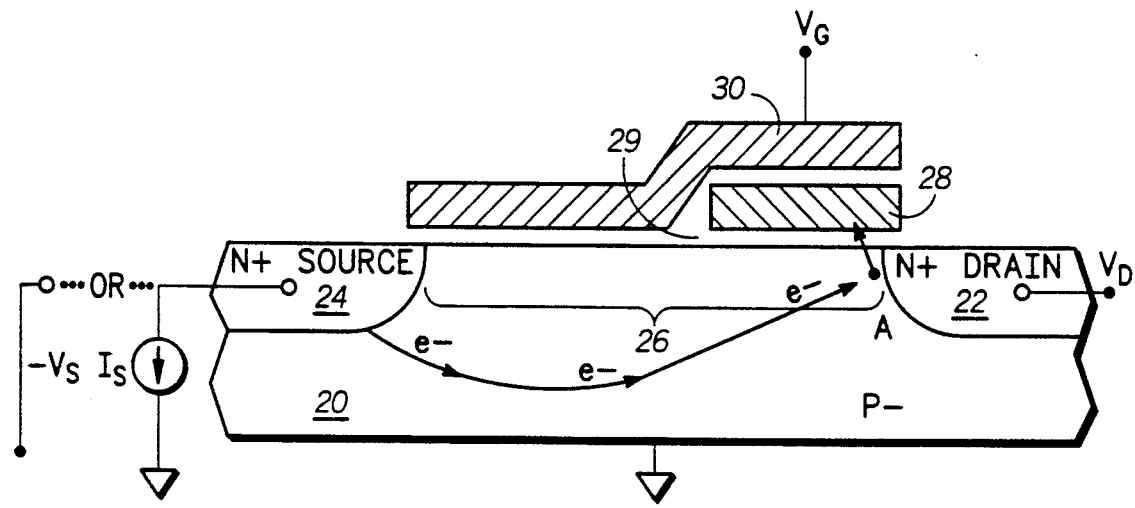
FIG. 1 is a cross-sectional illustration of a flash EEPROM cell in accordance with the present invention.

Illustrated in FIG. 1 is a cross-sectional view of a flash EEPROM cell in accordance with the present invention. A first diffused region, drain 22, is formed in a substrate 20. Substrate 20 is of a first conductivity type, for instance P-type, while drain 22 is of a second conductivity type, N-type. Common materials for substrate 20 include silicon or other semiconducting materials. Drain 22 may be formed in the substrate by known doping techniques, such as thermal diffusion or ion implantation. A second diffused region, source 24, is formed in substrate 20, displaced from drain 22 by a channel region 26. Source 24 is also of the second conductivity type. Channel region 26 is a portion of substrate 20, and therefore is of the first conductivity type. Overlying a portion of channel region 26 which is adjacent drain 22 is a conductive floating gate 28. Floating gate 28 is insulated from the underlying channel region by a dielectric, such as gate oxide 29. Floating gate 28 is also insulated from a control gate 30. Control gate 30 overlies most of the underlying channel region 26. As illustrated in FIG. 1, control gate 30 has a split gate, or stepped gate structure. In other words a portion of the control gate is adjacent the channel region and another portion is adjacent the floating gate. In another form, control gate 30 may instead be two separate gates. In yet another form, the floating gate may overlie most of the channel region, as in conventional EPROMs, in which case the control gate would not be adjacent the channel region. Both floating gate 28 and control gate 30 can be formed from polysilicon, or other conductive material suitable for use as gate structures.

The flash EEPROM cell illustrated in FIG. 1 is programmed, in other words the floating gate is charged, by performing three steps. The steps may be done simultaneously or may be sequential in time. One step is to apply a first programming voltage to drain 22, as depicted by $V_D$. In an N-channel device such as that illustrated in FIG. 1, the first programming voltage is positive. A suitable range for first programming voltage is between 6 and 12 volts. Another step is to force current into source 24 and through substrate 20 in order to deliver electrons to a junction between drain 22 and channel region 26, for example to junction A. This can be accomplished by applying a current, $I_S$, directly to source 24 or by applying a small negative voltage (not shown) to source 24. The current or voltage applied to source 24 need not be large, only sufficient to generate electrons at junction A. A current on the order of 50-200 $\mu$A or a voltage on the order of (−0.3) to (−0.5) volts is sufficient for most N-channel flash EEPROM devices. Conventional flash EEPROMs do not supply a source current, $I_S$, during programming. Typically, the source is grounded. However, by applying a source current, a larger supply of electrons develops near junction A than if the source were grounded. Thus, more hot electrons are available at junction A to be injected into floating gate 28. Referring to the two programming mechanisms, electron generation and electron injection, a source current enhances electron generation. Since electron generation is normally the rate limiting step in cell programming, programming time can be reduced by forcing current through source 24.

The remaining step in programming the flash EEPROM cell illustrated in FIG. 1 is to apply a second programming voltage, $V_G$, which has a ramp shaped leading edge to control gate 30. Applying a voltage to control gate 30 creates a potential such that electrons which are accumulated at junction A are injected into floating gate 28. While conventional flash EEPROMs also supply a voltage to the control gate, the present invention applies a voltage to the control gate in a manner which maximizes the flow of electrons, or current, to the floating gate. Thereby, the time to sufficiently charge, or program, floating gate 28 is minimized. The present invention improves programming speed by applying a ramped voltage to control gate 30. $V_G$ is ramped to an appropriate voltage with a period of time, for instance within the range of 5 $\mu$sec-100 $\mu$sec.

Figure 2:
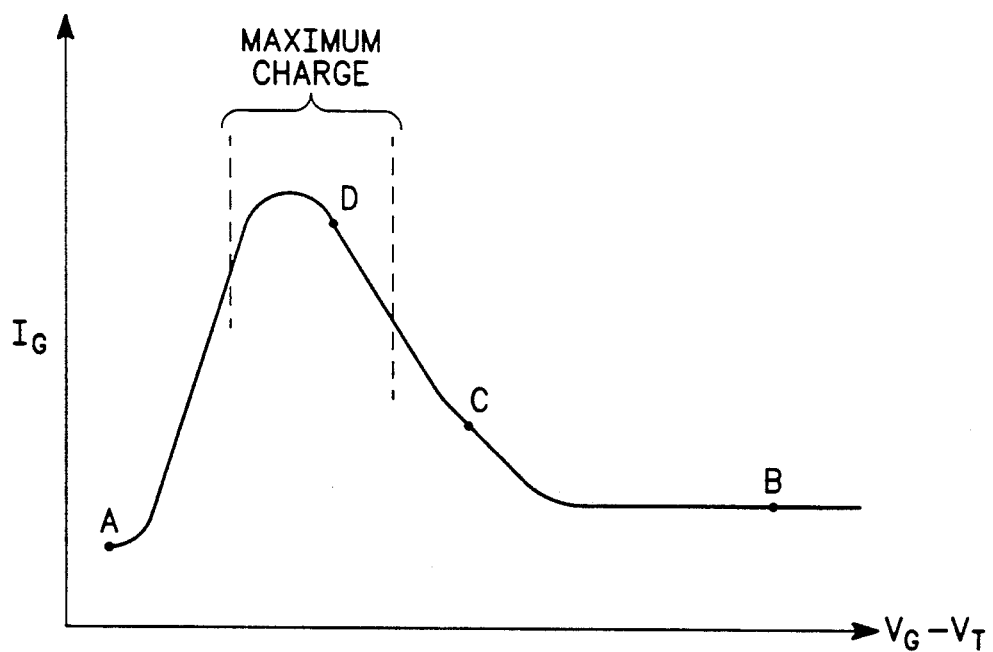
FIG. 2 is a graph illustrating gate current ($I_G$) as a function of difference between floating gate voltage and channel threshold voltage ($V_G - V_T$) for known flash EEPROM devices.

To better understand how ramping $V_G$ improves the programming speed, it is helpful to refer to the graph illustrated in FIG. 2. This graph depicts floating gate current ($I_G$) as a function of the difference between floating gate voltage ($V_G$) and channel threshold voltage ($V_T$) for a conventional flash EEPROM programming operation. A common approach to programming a flash EEPROM is to bias the drain, perhaps at 6 volts, ground the source, and bias the control gate, to perhaps 12 volts. In doing so, $V_G$ is held constant while $V_T$ varies until eventually the channel region becomes non-conductive. This can be demonstrated with respect to the graph in FIG. 2. Prior to programming, $V_G$ is at 0 volts while $V_T$ is a small, constant value, and $V_G - V_T$ can be depicted by point A. Upon applying a large, constant $V_G$, $V_T$ initially remains small, but gradually increases until the channel region becomes non-conductive and the value of $V_T$ approaches that of $V_G$. In FIG. 2, this is represented by traveling from point A, to point B, to point C, to point D and eventually back to point A.

Because charge is directly proportional to current, the maximum charge on the floating gate will occur when the floating gate current, $I_G$, is maximized. Therefore, the most desirable portion of the graph illustrated in FIG. 2 with respect to programming is the region between the dashed lines, where $I_G$ is maximized. This region represents the optimum programming window because maximizing charge on the gate will reduce programming time. While a majority of flash EEPROMs have the operating characteristics illustrated in FIG. 2, few take advantage of the maximum charge region. Referring to the programming operation discussed above, going from point A, to point B, to point C, to point D, and back to point A, a very small portion of time is spent in the maximum charge region. A majority of time required to program occurs between points B and C, where charging is minimal. One approach that has been proposed to take advantage of the maximum charge region is to program a flash EEPROM using a series of pulse voltages on the control gate. In using a series of pulse voltages, the cycle illustrated in FIG. 2 is repeated for each pulse. Therefore, rather than programming in the maximum charge region for a single, short period of time, a cell is programmed in this region for multiple, short periods of time. While using a series of pulse programming voltages provides an increase in the total amount of time under maximum charge conditions, it also increases the time under minimal charge conditions, and is therefore inefficient. Typically, each pulse requires 100 μsec and approximately 10 pulses are required to obtain sufficient charge on the floating gate.

The present invention enables a larger portion of programming time to occur in the maximum charge region, thus programming time is reduced. By ramping $V_G$, as in accordance with the present invention, the difference $(V_G-V_T)$ is maintained near a constant value for an extended period of time. As in other programming methods, applying a voltage to the control gate will gradually increase $V_T$. However by ramping the programming, $(V_G-V_T)$ does not get as large as in other programming methods. Referring to FIG. 2, ramping $V_G$ will increase $I_G$ from point A to point D. Because $V_G$ and $V_T$ are simultaneously increased, optimally at the same rate, $I_G$ remains approximately constant within the maximum charge region. Thus, not only is the amount of time under maximum charge conditions increased, but the amount of time at minimal charge conditions is practically eliminated because $I_G$ does not reach points B and C. Eventually $I_G$ will fall back to point A; however, the time spent under maximum charge conditions is sufficient to fully program a cell without repeating the cycle. A control gate voltage which ramps from 0 volts to 10 volts within 50 μsec is suitable for programming an N-channel flash EEPROM cell, in accordance with the present invention.

Figure 3:
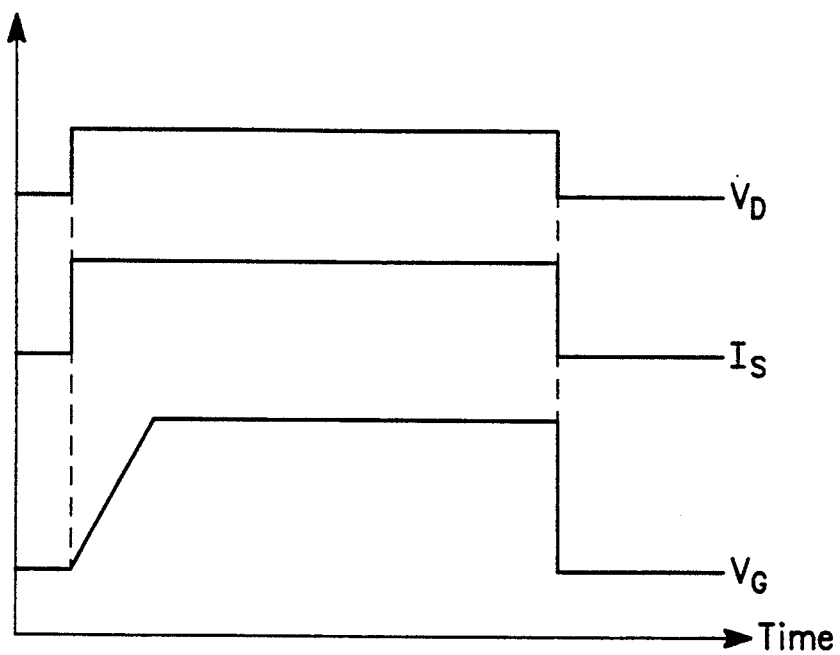
FIG. 3 is a timing diagram illustrating a programming sequence of a flash EEPROM in accordance with the present invention.

A summary of the programming steps in accordance with the present invention is illustrated in a timing diagram in FIG. 3. For an N-channel device, a positive voltage $(V_D)$ is applied to a drain region. This establishes an electric field under a floating gate. A current $(I_S)$ is forced through a source region in order to deliver electrons under the floating gate. Rather than forcing a current directly through the source region, a small voltage can be applied to the source, thereby achieving the same result. A voltage $(V_G)$ having a slowly rising leading edge is applied to a control gate in order to maximize the amount of charge delivered to the floating gate. For suitable values of $V_D$, $I_S$, and $V_G$, refer to those mentioned previously in this description. Although FIG. 3 illustrates that each of the steps begins and ends at the same point in time, this is not required to practice the present invention.

Figure 4:
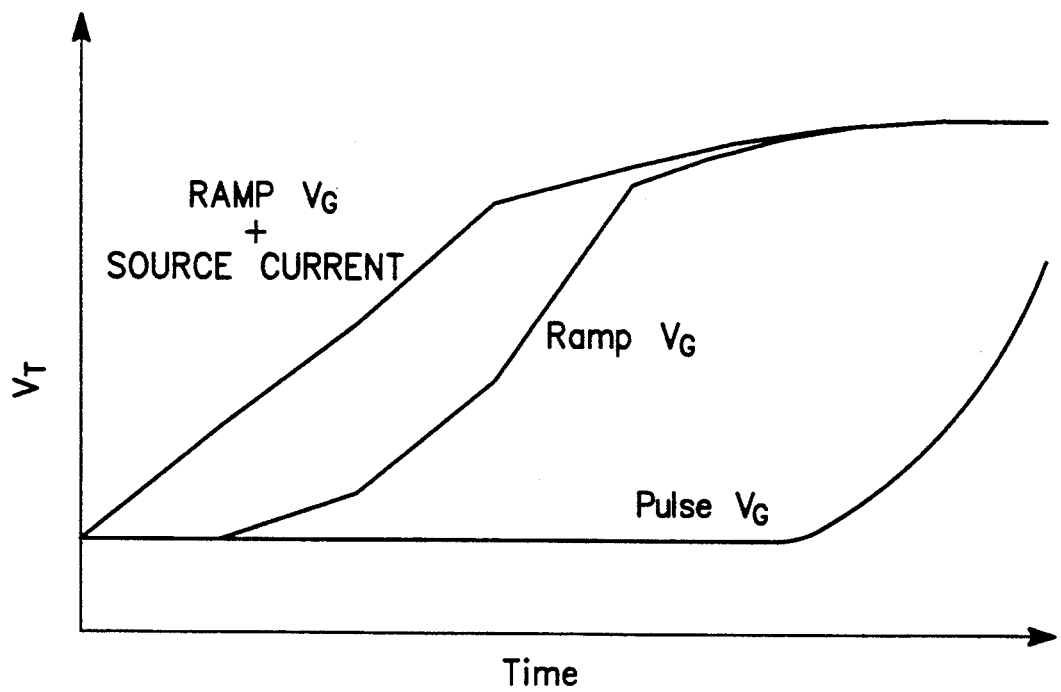
FIG. 4 is a graph comparing channel threshold voltage ($V_T$) as a function of time for a flash EEPROM device using three different programming techniques.

To illustrate the improvement provided by the present invention, FIG. 4 illustrates $V_T$ as a function of time for various programming methods. It is important to not that the programming speed is measured by the time it takes to increase $V_T$ to make the channel region nonconductive. The line labeled "Pulse $V_G$" is characteristic of $V_T$ variation using a conventional programming method which uses a single of pulse. As illustrated, $V_T$ remains constant for a period of time and eventually increases to a maximum value. However, by ramping the control gate voltage as indicated by the line labeled "Ramp $V_G$", rather than pulsing, $V_T$ increases more rapidly. Ramping $V_G$ in itself is an improvement over pulsing $V_G$ because $V_T$ reaches a maximum earlier in time. A further improvement is achieved by forcing a current through a source region while also ramping the control gate voltage. Forcing a current through a source and ramping the control gate voltage is a programming method in accordance with the present invention and is represented by the line labeled "Ramp $V_G$+Source Current" in FIG. 4. As discussed earlier, ramping $V_G$ permits the maximum amount of charge to be delivered to the floating gate (refer to the description of FIG. 2). Forcing a current to the source, increases the number of electrons generated at a junction beneath the floating gate. Thus, more electrons are available to charge the floating gate. Both of these factors, more available electrons and maximum control gate current $(I_G)$, provide improved programming speed.

The present invention improves programming speed of a flash EEPROM cell by improving electron generation. A greater number of electrons are generated by forcing a current through a source region of the cell. Due to the presence of a source current, electrons accumulate at a junction between a biased drain and a channel region. The electrons at the junction are injected into the floating gate, by conventional hot electron injection; however, the injection aspect of programming is more gradual than in conventional flash EEPROMs. While most flash EEPROMs are programmed with a constant gate voltage or a series of constant gate voltages, the present invention applies a gate voltage which has a rising leading edge. Although applying a ramped gate voltage injects electrons into the floating gate more gradually than other programming methods, the injection into the floating gate begins earlier than electron injection of conventional flash EEPROM cells. The more gradual electron injection provided by the present invention is offset by earlier electron injection, and thus improves programming speed.

Thus, it is apparent that there has been provided, in accordance with the present invention, a nonvolatile memory device with enhanced carrier generation and method for programming the same, that fully meets the advantages set forth previously. Although the invention has been described and illustrated with reference to specific embodiments, it is not intended that the invention be limited to these illustrative embodiments. Those skilled in the art will recognize that modifications and variations can be made without departing from the spirit of the invention. For example, the invention is not limited to the nonvolatile memory structures described or illustrated. More specifically, the present invention is not limited to use in conjunction with a flash EEPROM and is not limited to use in N-channel devices. Several memory structures are known, many of which can benefit from the present invention. Furthermore, it is not intended that the voltage and current ranges specified be limiting to the present invention. Processing parameters and variations in cell designs will determine suitable ranges for a given device, such that specifying a definite range of values is not practical. Therefore, it is intended that this invention encompass all such variations and modifications as fall within the scope of the appended claims.

We claim:

1. In a nonvolatile memory having a control gate overlying a channel region in a substrate, a floating gate overlying a portion of the channel region and positioned between the substrate and the control gate, and first and second diffused regions in the substrate which are displaced by the channel region, a method for programming the nonvolatile memory, comprising the steps of:

applying a first programming voltage to the first diffused region to create an electric field at a junction between the first diffused region and the portion of the channel region underlying the floating gate;

forcing current into the second diffused region and through the substrate in order to enhance carrier generation at the junction between the first diffused region and the portion of the channel region underlying the floating gate; and applying a second programming voltage having a ramped leading edge to the control gate to increase the electrical field and to program the memory to a predetermined logic state.

2. The method for programming the nonvolatile memory of claim 1 wherein the step of applying a first programming voltage to the first diffused region comprises applying a first programming voltage to the first diffused region which is a drain region and wherein the step of forcing a current into the second diffused region comprises forcing a current into the second diffused region which is a source region.

3. The method for programming the nonvolatile memory of claim 1 wherein the nonvolatile memory having a control gate comprises a nonvolatile memory having a split control gate.

4. The method for programming the nonvolatile memory of claim 1 wherein the steps of applying a first programming voltage to the first diffused region, forcing a current into the second diffused region, and applying a second programming voltage having a ramp shaped leading edge to the control gate are performed substantially at the same time.

5. The method for programming the nonvolatile memory of claim 1 wherein the step of forcing current into the second diffused region comprises applying a negative voltage, which is substantially in a range of $-0.3$ volts to $-0.5$ volts, to the second diffused region.

6. The method for programming the nonvolatile memory of claim 1 wherein the step of forcing current into the second diffused region comprises coupling a current source to the second diffused region.

7. The method for programming the nonvolatile memory of claim 6 wherein the step of forcing current into the second diffused region comprises forcing a current substantially in the range of 50 $\mu$A to 200 $\mu$A into the second diffused region.

8. The method for programming the nonvolatile memory of claim 1 wherein the step of applying a first programming voltage to the first diffused region comprises applying a first programming voltage substantially in the range of 6 volts to 12 volts to the first diffused region.

9. The method of programming the nonvolatile memory of claim 1 wherein the nonvolatile memory comprises a first control gate and a second control gate, the first control gate overlying the channel region and the floating gate, and the second control gate overlying the channel region and being positioned adjacent the floating gate and the substrate.

10. The method of programming the nonvolatile memory of claim 1 wherein the nonvolatile memory is a flash EEPROM.

11. The method of programming the nonvolatile memory of claim 1 wherein the nonvolatile memory is an EPROM.

12. In a nonvolatile memory having a control gate overlying a channel region in a substrate, a floating gate overlying a portion of the channel region and positioned between the substrate and the control gate, a source region and a drain region in the substrate which are displaced by the channel region, a method for programming the nonvolatile memory, comprising the steps of:

applying a first programming voltage to the drain region to create an electric field at a junction between the drain and the portion of the channel region underlying the floating gate;

actively forcing current through the source in order to enhance carrier generation at the junction; and applying a second programming voltage having a ramped leading edge to the control gate to increase the electrical field at the junction and to program the memory to a predetermined logic state.

13. The method for programming of claim 12 wherein the step of actively forcing current comprises coupling the source to a current source.

14. The method for programming of claim 12 wherein the step of actively forcing current comprises applying a negative voltage to the source.

* * * * *